(12) United States Patent  (10) Patent No.: US 7,483,687 B2
Carrez  (45) Date of Patent: Jan. 27, 2009

(54) QUADRATURE SUB-HARMONIC FREQUENCY DOWN-CONVERTER

(76) Inventor: Frederic Carrez, 8 Captain Parker Arms, #24, Lexington, MA (US) 02421

( * ) Notice: Subject to any disclaimer, the term of this patent is extended or adjusted under 35 U.S.C. 154(b) by 453 days.

(21) Appl. No.: 11/431,972

(22) Filed: May 11, 2006

(65) Prior Publication Data

US 2007/0264959 A1 Nov. 15, 2007

(51) Int. Cl.
*H04B 1/10* (2006.01)
(52) U.S. Cl. .................. 455/318; 455/323; 455/333
(58) Field of Classification Search .............. None
See application file for complete search history.

(56) References Cited

U.S. PATENT DOCUMENTS

| 6,282,413 | B1 | 8/2001 | Baltus |
| 6,370,372 | B1 * | 4/2002 | Molnar et al. ............. 455/323 |
| 6,810,242 | B2 | 10/2004 | Molnar et al. |
| 6,813,485 | B2 | 11/2004 | Sorrells et al. |
| 2003/0143966 | A1 | 7/2003 | Kim et al. |
| 2004/0063419 | A1 | 4/2004 | Molnar et al. |
| 2004/0121751 | A1 | 6/2004 | Shen |
| 2007/0242779 | A1 * | 10/2007 | Choi et al. ................. 375/332 |
| 2008/0009259 | A1 * | 1/2008 | Chang et al. .............. 455/318 |

FOREIGN PATENT DOCUMENTS

EP 1 278 301 A2 1/2003

* cited by examiner

*Primary Examiner*—Thanh C Le
(74) *Attorney, Agent, or Firm*—Saul Ewing LLP; Theodore Naccarella

(57) ABSTRACT

A method and apparatus for frequency down-converting a radio frequency (RF) signal to baseband in two steps using the two quadrature components of a single local oscillator. In the first stage, the RF signal is mixed with both components of the local oscillator signal (LO) in a sub-harmonic mixer to produce an intermediate frequency (IF) output signal having a frequency component at twice the local oscillator frequency minus the RF frequency, i.e., (2×LO)−RF=IF. In the second stage, the IF signal is split into two and supplied to a quadrature mixer that mixes the IF signal with the I component of the same local oscillator signal and separately mixes the IF signal with the Q component of the same local oscillator signal to produce an output signal comprising an I component and a separate Q component at baseband.

22 Claims, 7 Drawing Sheets

QUADRATURE SUB-HARMONIC FREQUENCY DOWN-CONVERTER

FIELD OF THE INVENTION

The invention pertains to radar and wireless communications systems, such as cellular telephone communications systems and television and radio communications systems.

BACKGROUND OF THE INVENTION

Generally, in any type of wireless communication system, baseband voice or data signals are carried on a radio frequency (RF) carrier frequency. Thus, circuitry must be provided in a transmitter that places the baseband signal on the RF carrier signal. This process is commonly termed frequency up-conversion and the circuitry that performs this process is commonly called a frequency up-converter. Likewise, in the receiver, the baseband signal must be extracted from the incoming RF receive signal picked up by the receive antenna. This process is commonly termed frequency down-conversion and the circuitry that performs this process is commonly called a frequency down-converter.

There are several techniques in common use for performing frequency up-conversion and frequency down-conversion. One such technique is heterodyning. In heterodyning, the conversion between the RF frequency $F_{RF}$ and the baseband frequency $F_{BB}$ (in either direction) is conducted in two steps. That is, taking frequency down-conversion as an example, the received RF signal is first mixed with a first local oscillator ($LO_1$) signal having a fixed frequency $F_{LO1}$ spaced relatively far away from the RF carrier frequency, e.g., ½ the RF carrier frequency. When two signals such as the RF signal and the $LO_1$ signal are mixed, it produces signals at sideband frequencies of $F_{RF}-F_{LO1}$ and $F_{RF}+F_{LO1}$. The output of the mixer is filtered to eliminate the $F_{RF}+F_{LO1}$ sideband. The remaining signal at the $F_{RF}-F_{LO1}$ side band is herein termed the intermediate frequency or IF signal at frequency $F_{IF}$. That signal is then introduced into a second mixer in which it is mixed with a second local oscillator signal ($LO_2$) having the same frequency as the center frequency of the IF signal, namely, $F_{LO2}=F_{IF}$. Accordingly, the output of the second mixer has a center frequency of $F_{IF}-F_{LO2}$. Since, as noted above, $F_{IF}$ and $F_{LO2}$ have the same frequency, $F_{IF}-F_{LO2}=0$ Hz, i.e., the center frequency of the output of this second mixer is at DC (or 0 Hz). Accordingly, the signal output from this second mixer is at baseband, i.e., only the baseband data signal remains. The baseband signal is then, of course, provided to signal processing circuitry for extracting the data from it.

One of the disadvantages of the heterodyning technique is that it requires two local oscillators and their incumbent circuitry, expense, and complexity.

Thus, it is common today to perform frequency down-conversion from the RF frequency to the baseband in a single step. These techniques are called direct conversion techniques. Direct conversion techniques generally fall into two categories, namely, zero-IF and low-IF techniques.

FIG. 1A is a block diagram illustrating a zero-IF direct frequency down-converter. In this technique, the RF signal is input to a low noise amplifier 101 in order to produce an amplified RF signal. The amplified RF signal is split into two. One branch is fed to a first mixer 103 that mixes it with a local oscillator signal, the local oscillator signal being equal in frequency to the center frequency of the RF signal. The other branch is fed to a second mixer 105 that mixes it with a second local oscillator signal having the same frequency as the first local oscillator signal, but 900 out of phase with it. The outputs of the two mixers 103 and 105 are each passed through low pass filters 107 and 109, respectively, to produce two baseband signals centered at DC and 90° out of phase with each other in order to reject the image frequency at the input of the receiver.

FIG. 1B is a block diagram illustrating a low-IF frequency down-converter for comparison. This technique is similar to the zero-IF technique described above, except that the ultimate output actually is not at DC, but instead is slightly displaced from 0 Hz (e.g., a few MHz) in order to avoid problems associated with DC offset at the output of the mixers and also to eliminate low frequency noise issues. In this technique, the RF signal is input to a low noise amplifier 111 in order to produce an amplified RF signal. The amplified RF signal is split into two. One branch is fed to a first mixer 113 that mixes it with a local oscillator signal, the local oscillator signal being offset slightly in frequency (e.g., a few MHz) from the center frequency of the RF signal. The other branch is fed to a second mixer 115 that mixes it with a second local oscillator signal having the same frequency as the first local oscillator signal, but 90° out of phase with it. The outputs of the two mixers 113 and 115 are each passed through band pass filters 117 and 119, respectively, to produce two baseband signals at a relatively low frequency (e.g., a few MHz) and 90° out of phase with each other.

The steps of zero-IF and low-IF frequency up-conversion are essentially the opposite of those described for zero-IF and low-IF frequency down-conversion.

FIG. 1C is a block diagram of an exemplary zero-IF quadrature direct frequency up-converter. A quadrature baseband signal comprising two components $BB_I$ and $BB_Q$ are first fed through first and second low pass filters 138, 139. The outputs of the low pass filters are fed to first and second mixers 141, 142, respectively, where they are mixed with the two quadrature components $LO_I$ and $LO_Q$ of a quadrature local oscillator signal. The frequency of the local oscillator signal is the desired RF transmission frequency. The output of the two mixers 141, 142 are combined in an adder 144. The output of the adder 144 is fed to an amplifier 146. The output of the amplifier 146 is the RF signal forwarded to the antenna for transmission.

The advantages of both zero-IF and low-IF direct conversion is that they require only a single local oscillator having two different phases, rather than two local oscillators at different frequencies. A significant disadvantage of direct conversion, however, is the need for a local oscillator that oscillates all the way up at the $F_{RF}$ frequency (or very close to it, in the case of a low-IF technique). Generally, the higher the frequency at which a circuit must operate, the more complex, power-hungry, and expensive that circuit tends to be.

Sub-harmonic mixers also are known in the prior art. In conventional sub-harmonic mixers, the incoming RF signal is mixed with a local oscillator signal having a very high amplitude relative to the amplitude of the incoming RF signal in order to produce non-linearities. Due to the presence of those non-linearities, the sub-harmonic mixer produces output signals not only at the difference between the local oscillator signal and the incoming RF signal ($F_{LO}-F_{RF}$), but also at harmonics thereof, such as $2F_{LO}-F_{RF}$. Accordingly, by using a sub-harmonic mixer, one may utilize a local oscillator that oscillates at a much lower frequency than the RF signal center frequency and still produce signals at baseband or any desired IF band. For instance, let us assume that it is desired to produce an intermediate frequency signal at 8 GHz from a received RF signal at 24 GHz. Using the principles of sub-harmonic mixing, one can employ a sub-harmonic mixer to mix the RF signal with a local oscillator signal at 8 GHz to produce an output having a sideband component at 8 GHz. Particularly, 8 GHz is $2F_{LO}-F_{RF}$. On the other hand, if one used a more conventional mixer, it would require a local oscillator operating at 16 GHz to produce an output signal having a frequency component at 8 GHz (i.e., 24 GHz–16 GHz=8 GHz).

There are wireless communications systems in use today and/or in development that transmit at frequencies of 10 GHz or even 24 GHz or higher. Accordingly, direct frequency up-conversion and down-conversion in connection with these signals would require very high frequency (and therefore very complex, very expensive, and very power-hungry) local oscillators and phase locked loops (PLLs).

Accordingly, it is an object of the present invention to provide an improved method for performing frequency down-conversion.

It is another object of the present invention to provide an improved apparatus for performing frequency down-conversion.

SUMMARY OF THE INVENTION

The invention is a method and apparatus for frequency down-converting a first data signal centered at a first frequency to a second data signal containing the same data as the first data signal and centered at a second frequency lower than the first frequency involving receiving the first data signal at the first frequency; mixing the first data signal with a local oscillator signal having a third frequency about one third of the first frequency in a sub-harmonic mixer to produce a third data signal having a fourth frequency that is a harmonic frequency of the first frequency and the third frequency; mixing the third data signal with the first component of the quadrature local oscillator signal at the third frequency to produce a first component of the second data signal centered at the second frequency; and mixing the third data signal with the second component of the quadrature local oscillator signal at the third frequency to produce a second component of the second data signal centered at the second frequency.

DETAILED DESCRIPTION OF THE INVENTION

The present invention pertains to a quadrature sub-harmonic frequency down-converters and up-converters that frequency convert between baseband and and RF in two stages having the advantages of requiring only a single local oscillator frequency much lower than the received RF signal frequency.

The invention uses the two quadrature components of a single local oscillator signal. Using a down-converter as an example, the first stage, the RF signal is mixed with both components of a local oscillator signal (LO) at or about one third the RF frequency in a sub-harmonic mixer using multi-phase LO signals, in this case, two signals in quadrature, to produce an intermediate frequency output signal (IF) having a frequency of twice the local oscillator frequency minus the RF frequency. i.e., $2F_{LO}-F_{RF}=\frac{1}{3}F_{RF}=F_{IF}$. In a second stage, that IF signal is split into two and supplied to a quadrature mixer that mixes the IF signal with the I component of the same local oscillator signal and separately mixes the IF signal with the Q component of the same local oscillator signal to produce a signal at or about baseband comprising an I component and a separate Q component. Particularly, the output has a frequency component at $3F_{LO}-F_{RF}$ (since $F_{IF}=2F_{LO}-F_{RF}$) and since the local oscillator signal LO has a frequency of about one third the center frequency of the received RF signal, $3F_{LO}=F_{RF}$. Therefore, $3F_{LO}-F_{RF}=$about $OH_Z$ or baseband.

This solution permits effective frequency conversion between RF and baseband in two conversion steps, but using only a single local oscillator. Further, that local oscillator oscillates at a lower frequency than the local oscillator of a direct conversion frequency converter. The present invention, therefore, provides a less expensive, less complex, and lower powered frequency converter than conventional frequency converters.

Figure 1A:
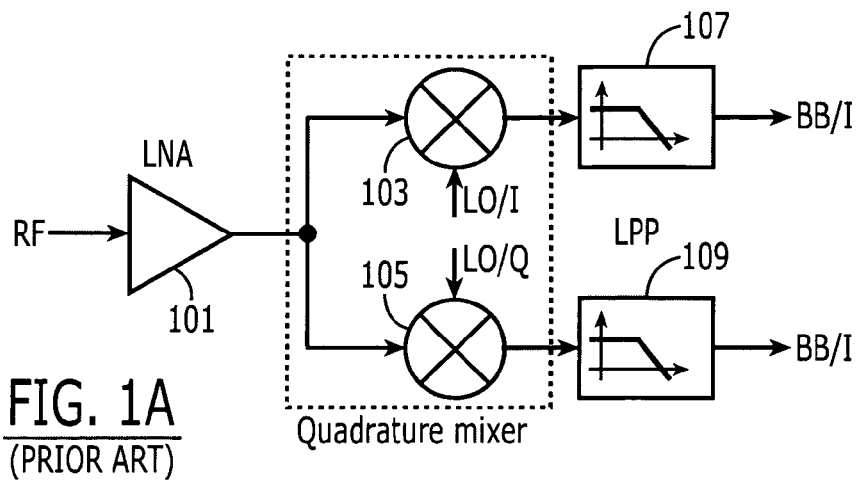
FIG. 1A is a block diagram of an exemplary zero-IF quadrature down-converter circuit of the prior art.
Figure 1B:
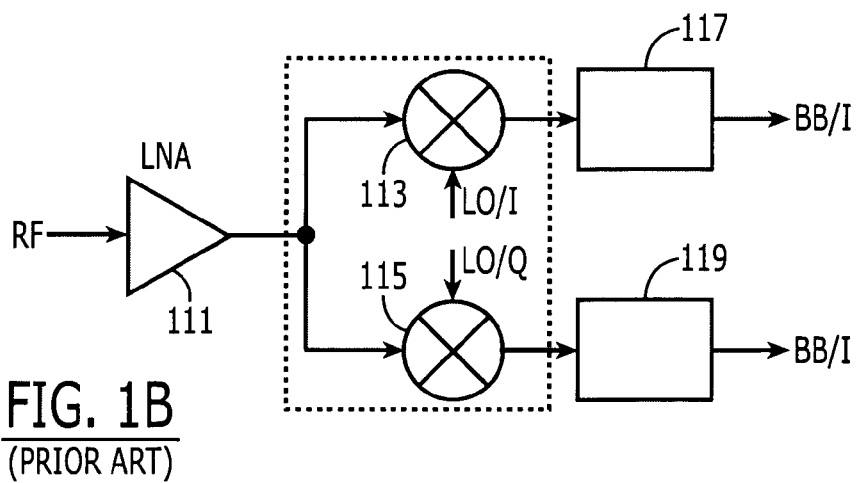
FIG. 1B is a block diagram of an exemplary low-IF quadrature down-converter circuit of the prior art.
Figure 1C:
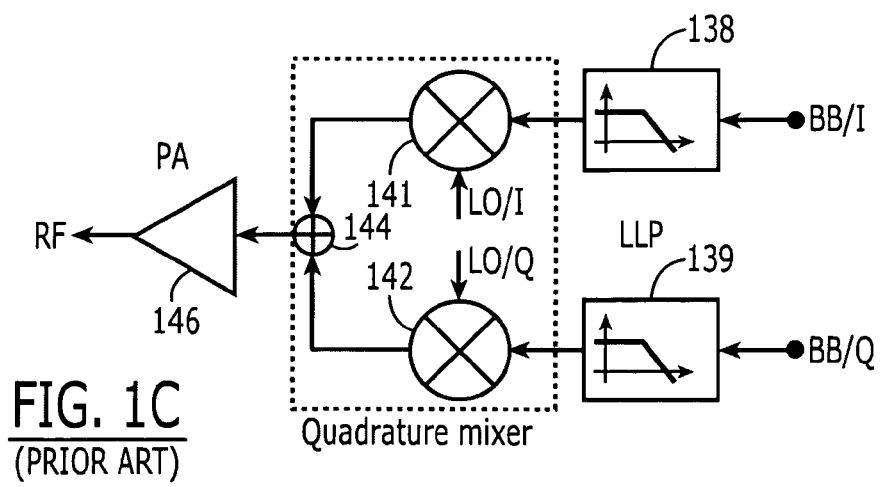
FIG. 1C is a block diagram of an exemplary low-IF quadrature up-converter circuit of the prior art.
Figure 2A:
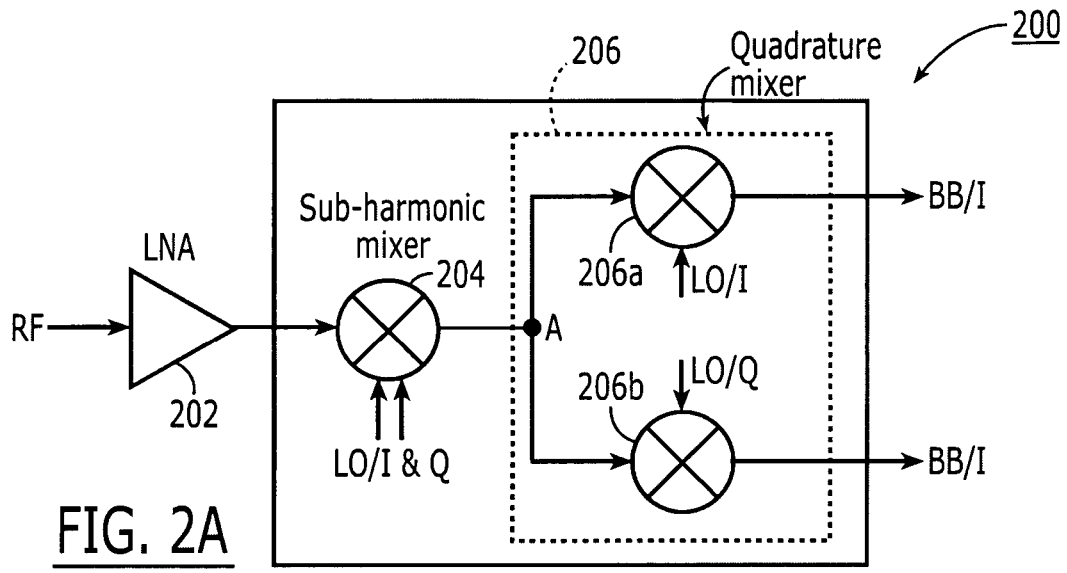
FIG. 2A is a block diagram of a quadrature sub-harmonic frequency down-converter in accordance with the principles of the present invention.

FIG. 2A is a block diagram illustrating the basic components of an exemplary frequency down-converter 200 in accordance with the principles of the present invention.

First, a received RF signal from an antenna is amplified in a low noise amplifier 202. The amplified received RF signal is provided to one input of a sub-harmonic mixer 204. Mixer 204 has two other input terminals for receiving two local oscillator signals having the same frequency, but 90° out of phase with each other, i.e., in quadrature. These two signals are hereinafter termed $LO_I$ and $LO_Q$. The local oscillator has a frequency, $F_{LO}$, that is one third the RF signal frequency, $F_{RF}$. Thus, merely as an example, if the RF signal has a frequency of 24 GHz, the local oscillator needs to generate a signal at only 8 GHz. Hence, the local oscillator can be less complex, lower in cost, and lower in power requirements than in a direct conversion type frequency down-converter, which would require a higher frequency local oscillator. The sub-harmonic mixer 204 uses multi-phase LO signals so that the signal output from the mixer 204 comprises a plurality of harmonic components. Thus, instead of producing the usual sideband components at $F_{RF}-F_{LO}$ and $F_{RF}+F_{LO}$, it produces sideband frequency components at harmonics, including $2F_{LO}-F_{RF}$ and $2F_{LO}+F_{RF}$. Of interest in the present technique is the harmonic component at $2F_{LO}-F_{RF}$, which shall be used as the intermediate frequency or IF signal.

The IF signal output from the sub-harmonic mixer 204 is split into two and fed into a quadrature mixer 206 comprising mixers 206a and 206b. Mixer 206a mixes the IF signal with the $LO_I$ component of the local oscillator, while mixer 206b mixes the IF signal with the $LO_Q$ component of the local oscillator. This is the same local oscillator used in sub-harmonic mixer 204.

Accordingly, the output of the quadrature mixer 206 comprises two signals that are 90° out of phase with each other and having a frequency component at $3F_{LO}-F_{RF}$ (since $F_{IF}=2F_{LO}-F_{RF}$). Since the local oscillator signal LO has a frequency of one third the center frequency of the received RF signal, $3F_{LO}=F_{RF}$ or $3F_{LO}-F_{RF}=0$ $H_Z$. Therefore, these two signals are at DC (or baseband).

These two baseband quadrature signals hereinafter termed $BB_I$ and $BB_Q$, respectively, comprise the baseband signal that was carried on the original received RF signal. They are forwarded to further signal processing for extracting whatever data is contained in those signals.

Figure 2B:
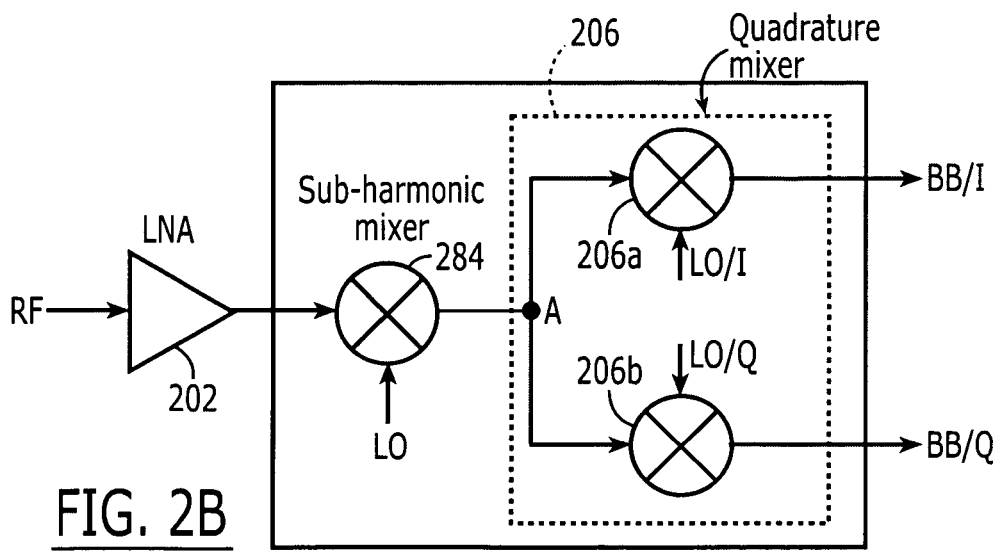
FIG. 2B is a block diagram of another quadrature sub-harmonic frequency down-converter in accordance with the principles of the present invention.

Sub-harmonic mixer 204 can be replaced with a non-linear sub-harmonic mixer 284, as illustrated in FIG. 2B. All other components remained essentially the same as shown in FIG. 2A. Mixer 284 is a different kind of sub-harmonic mixer is then mixer 204 described above in connection with FIG. 2B. Instead of mixing the RF signal with both the I and Q components of LO, it mixes the RF signal only with one component of the LO signal, i.e., $LO_I$. However, $LO_I$ is amplified to a very high amplitude relative to the amplitude of the RF signal in order to produce non-linearities in the mixer, resulting in the generation of output signals with components at harmonics of $F_{LO}-F_{RF}$, such as $2F_{LO}-F_{RF}$, just as in the FIG. 2A embodiment.

Figure 3A:
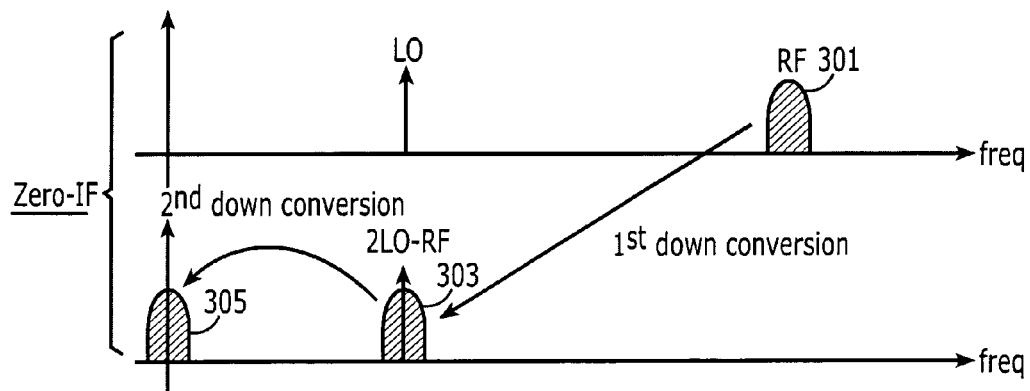
FIG. 3 is a graph illustrating the frequency down-conversion steps in accordance with the principles of the present invention.

FIG. 3A helps illustrate the two frequency conversion steps in accordance with the above-described exemplary embodiment of the invention. As shown at 301, the incoming signal is centered at frequency $F_{RF}$. The output of the sub-harmonic mixer includes the sideband component of interest 303 centered at frequency $2F_{LO}-F_{RF}$. Assuming that the local oscillator signal is at a frequency equal to one third of the RF signal frequency, this intermediate frequency, $F_{IF}=2F_{LO}-F_{RF}=F_{RF}/3$. In the second down-conversion step, in which the IF signal 303 at frequency $2F_{LO}-F_{RF}$ is mixed with the same local oscillator signal at frequency $F_{LO}$, the signal is further converted down to the baseband signal 305 (0 Hz) since, in this example, $F_{LO}=F_{RF}/3$ and $F_{IF}=F_{RF}/3$. Thus, $F_{LO}=F_{IF}$ such that $F_{IF}-F_{LO}=0$.

Alternately, if desired, one may construct a sub-harmonic quadrature mixer in accordance with the principles of the present invention to produce a baseband signal that is slightly offset from DC in order to obtain the aforementioned advantages of low-IF down-conversion. This is accomplished by making the local oscillator frequency slightly more or slightly less than one third $F_{RF}$. The offset from one third $F_{RF}$ should be such that the baseband signal has a frequency low enough that it can be processed by a digital or analog signal processor. Presently, digital processors that can handle data signals at frequencies as high as about 1 GHz are known. Accordingly, the offset from $F_{RF}/3$ may be as much as 333.3 MHz (i.e., one third of 1 GHz) and that number will only increase as higher speed and more powerful processors become available. More preferably, however, with currently available processors, the offset from $F_{RF}/3$ should be kept within about 100 MHz or 200 MHz.

Figure 3B:
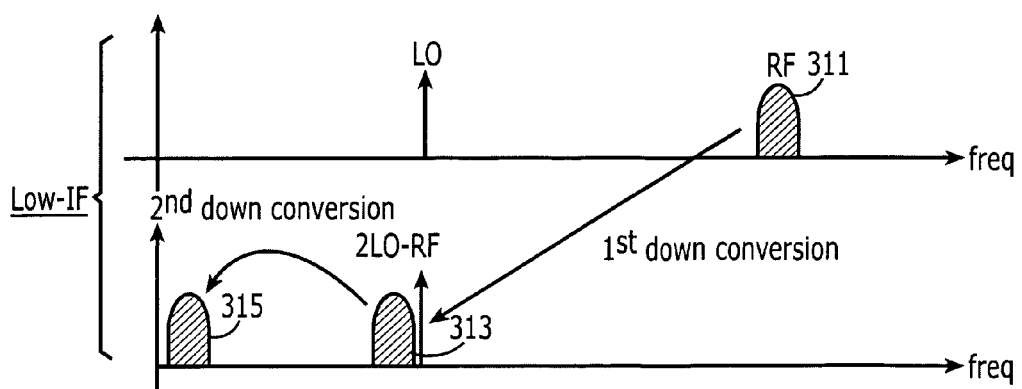

FIG. 3B illustrates the frequency conversion steps for a low-IF embodiment. Particularly, as shown at 311, the incoming signal is at frequency $F_{RF}$. The sub-harmonic mixer mixes that signal with a local oscillator signal having a frequency slightly offset from $F_{RF}/3$. In this example, it is slightly higher than $F_{RF}/3$. Thus, the output of the sub-harmonic mixer includes a component slightly offset from $2F_{LO}-F_{RF}$, (i.e., slightly offset from $F_{RF}/3$), as shown at 313. In the second down-conversion step, in which the IF signal 313 is mixed with the same local oscillator signal at frequency $F_{RF}/3$, the signal is converted down to a frequency centered slightly higher than DC (0 Hz) as shown at 315.

Figure 4:
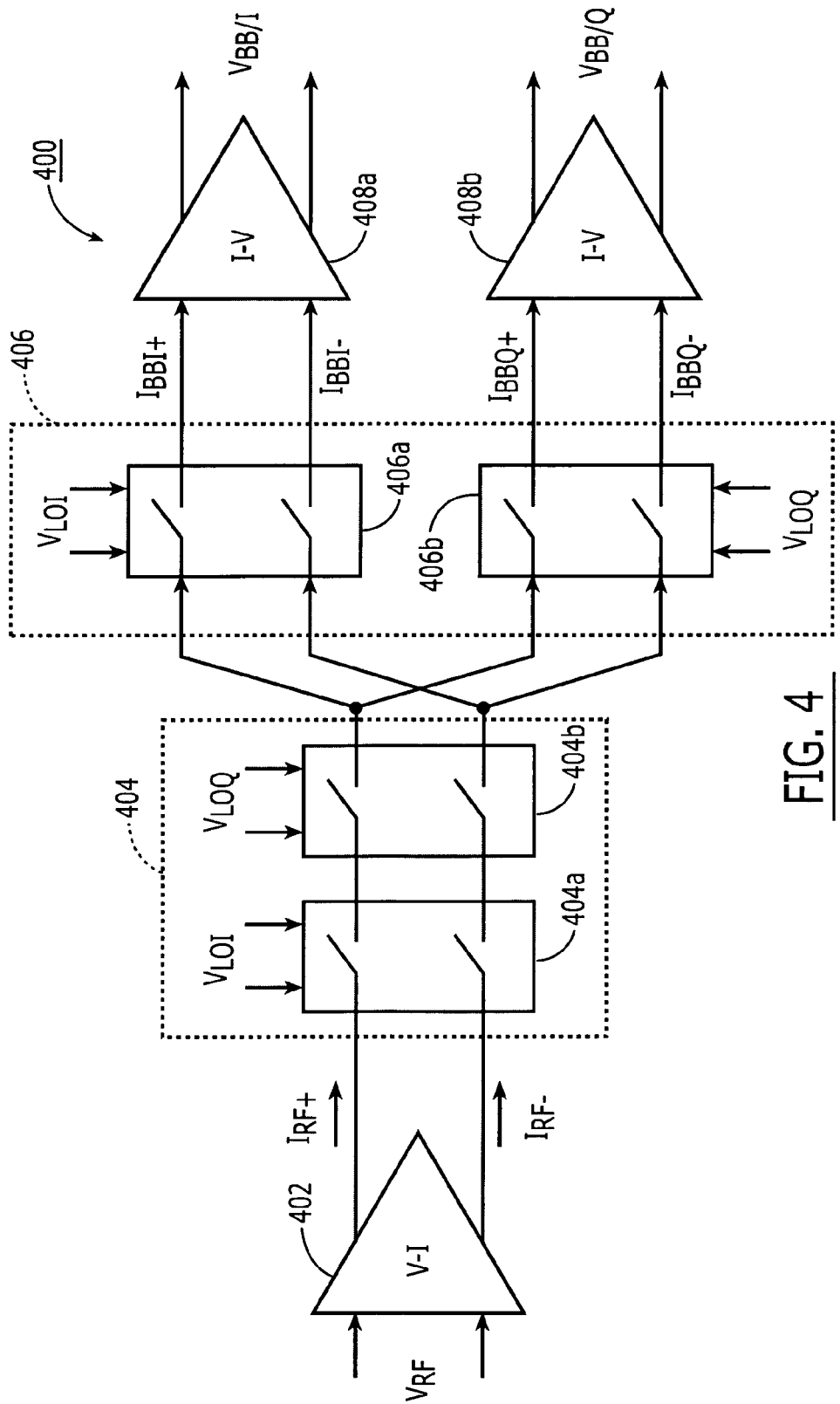
FIG. 4 is a schematic diagram of a quadrature sub-harmonic frequency down-converter in accordance with the principles of the present invention.

FIG. 4 is a more detailed circuit diagram of a quadrature sub-harmonic frequency down-converter in accordance with the principles of the present circuit 400. FIG. 4 illustrates a differential embodiment of the circuit 400. Accordingly, the incoming RF voltage signal from the antenna is represented as $V_{RF+}$ and $V_{RF-}$. The incoming RF voltage signal from the antenna is input to a voltage to current converter 402. It generates two output signals, namely, $I_{RF+}$ and $I_{RF-}$. These two signals are placed at the inputs of a sub-harmonic converter 404 comprising two switch cells 404a and 404b. Switch cell 404a mixes $I_{RF+}$ and $I_{RF-}$ with the first component of the local oscillator signal, $V_{LO/I}$, while switch cell 404b mixes the output of switch cell 404a with the second component of the local oscillator signal, $V_{LO/Q}$, which has the same frequency as $V_{LO/I}$, but is 90° out of phase with it.

Accordingly, the output of the sub-harmonic mixer 404 comprises a differential signal having a frequency component at $2F_{LO}-F_{RF}$. The two components of the differential signal are hereinafter termed IF+ and IF−. Each of the two signals are split in two and fed into the inputs of the quadrature mixer 406. Quadrature mixer 406 comprises two switch cells 406a and 406b. Switch cell 406a mixes the differential signal with $V_{LO/I}$ and switch cell a 406b mixes the differential signal with $V_{LO/Q}$. Accordingly, the output of the quadrature mixer is the baseband signal carried on the incoming RF signal and comprises four signal lines, namely, $BB_{I+}$, $BB_{I-}$, $BB_{Q+}$, and $BB_{Q-}$.

These baseband signals are then converted from current to voltage signals by voltage converters 408a and 408b to produce two differential voltage signals 90° out of phase with each other, $V_{BB/I}$ and $V_{BB/Q}$, each comprising a differential signal. In other words, there are four output signal lines, namely, $V_{BB/I+}$, $V_{BB/I-}$, $V_{BB/Q+}$, and $V_{BB/Q-}$.

All of the switches are shown schematically in FIG. 4 to emphasize the fact that the invention can be implemented in any reasonable technology, including, for example, bipolar, CMOS, BiCMOS, MOSFET, and MESFET.

Figure 5A:
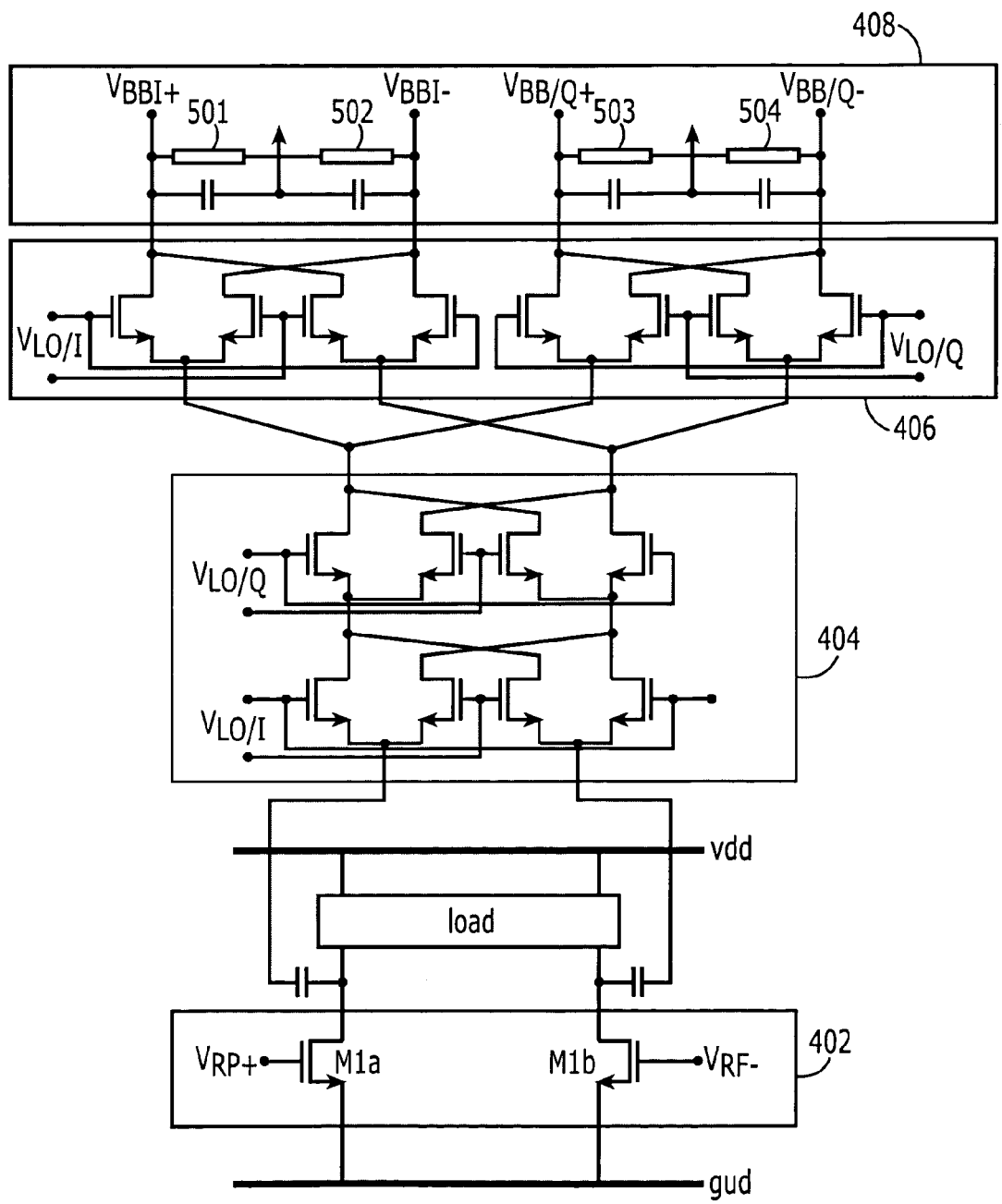
FIG. 5A is a circuit diagram of a quadrature sub-harmonic frequency down-converter in accordance with one possible implementation of the present invention.

FIG. 5A is an exemplary circuit implementation of the sub-harmonic quadrature frequency down-converter shown in FIG. 4 implemented in NMOS technology. Particularly, the voltage-to-current converter 402 is implemented as two NMOS transistors M1A and M1B. The current flow terminals of M1A and M1B are coupled between $V_{DD}$ and ground. The gates of those two transistors are coupled to the RF+ and RF− signals, respectively. The sub-harmonic mixer 404 comprises two switch cells 404a and 404b, each implemented by four NMOS transistors, as shown. The quadrature mixer 406, comprising switch cells 406a and 406b as previously described, are implemented using the same transistor design as in the sub-harmonic mixer, namely, each switch comprising four NMOS transistors connected as shown. Finally, the current-to-voltage converter 408 is shown as a passive converter using resistors 501, 502, 503, and 504 to convert the current signals to voltage signals.

Figure 5B:
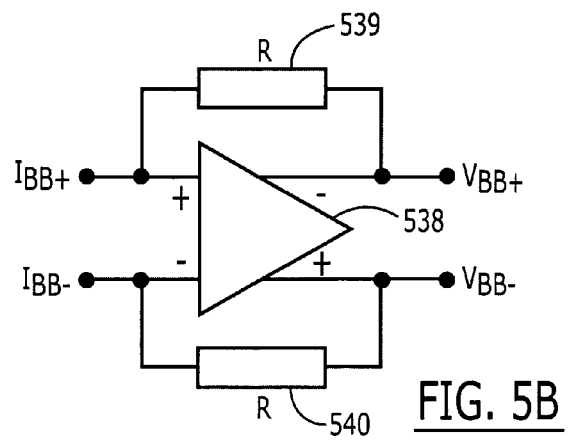
FIG. 5B is a schematic diagram of an alternative embodiment of the current to voltage converter circuit in FIG. 5A.

Alternately, the current and voltage converter could be formed of active circuit components such as illustrated in FIG. 5B. Particularly, a differential operational amplifier 538 receives $I_{BB+}$ and $I_{BB-}$ at its non-inverting and inverting inputs, respectively. Feedback resistors 539 and 540 are coupled between the inputs and outputs of the operational amplifier 538, as shown.

Figure 6:
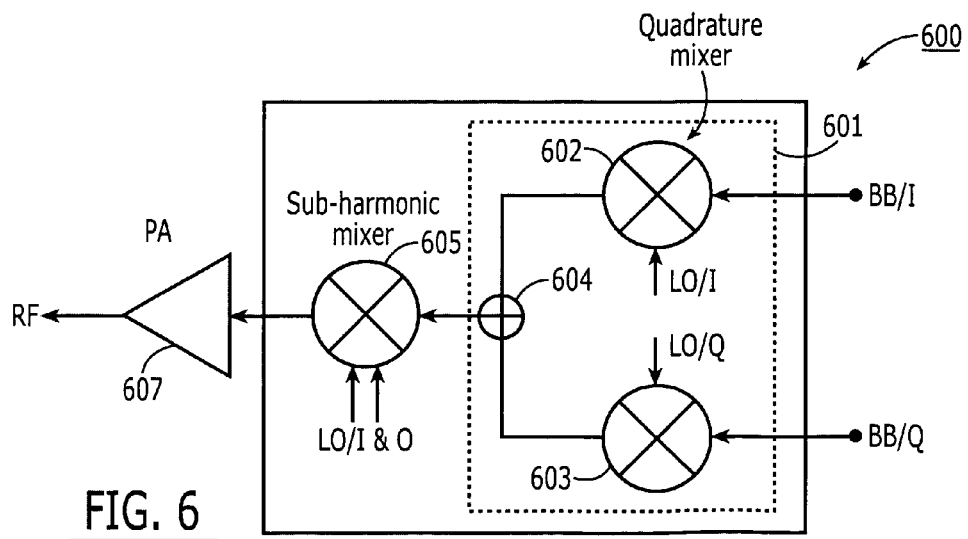
FIG. 6 is a schematic diagram of a quadrature sub-harmonic frequency up-converter in accordance with the principles of the present invention.

The technique and apparatus in accordance with the present invention for frequency up converting a baseband signal to the RF transmission signal are essentially the opposite of that described above for the frequency down-conversion process. FIG. 6 is a block diagram of a sub-harmonic quadrature frequency up-converter 600 in accordance with the principles of the present invention. As shown, a quadrature baseband signal comprising components $BB_I$ and $BB_Q$ are fed to inputs of first and second mixers 602 and 603 of quadrature mixer 601, where they are mixed with the quadrature components $LO_I$ and $LO_Q$ of a quadrature local oscillator. Again, for exemplary purposes, let us assume that the local oscillator has a frequency of one third the desired RF transmission frequency.

The outputs of the mixers 602 and 603 are centered at the frequency of the local oscillator minus the frequency of the baseband signal and at the frequency of the local oscillator plus the frequency of the baseband signal, i.e., $F_{LO} \pm F_{BB}$. Assuming a zero-IF type embodiment of the invention, the center frequency of the baseband signal is 0 Hz. Therefore, we can essentially say that the intermediate frequency $F_{IF}$ of the signals at the outputs of the mixers 602, 603 is $F_{LO}$–0Hz=$F_{LO}$, which is ⅓ $F_{RF}$.

The outputs of the two mixers 602, 603 in the quadrature mixer 601 are combined in an adder 604. The output of the adder 604 is fed into one input of a multi-phase sub-harmonic mixer 605. The multi-phase sub-harmonic mixer mixes this combined signal with the same local oscillator signals LOI and LOQ that were used in the quadrature mixer 601. The output of the sub-harmonic mixer 605 comprise components at various harmonics, including, at least, a frequency component at $2F_{LO}+F_{IF}$, which alternately may be written as $2F_{LO}+F_{LO}=3F_{LO}=F_{RF}$ since $F_{LO}=F_{IF}=⅓F_{RF}$. The other frequency components contained in the output of the sub-harmonic mixer, such as the harmonic at $2F_{LO}-F_{LO}=F_{LO}$ can be easily filtered.

The description above is of a zero-IF type embodiment of the invention. In a low-IF type embodiment, these frequencies would instead be $2F_{LO}+F_{LO}\pm F_{BB}=3F_{LO}\pm F_{BB}$.

The quadrature outputs of the sub-harmonic mixer 605 are fed into a power amplifier 607, where they are amplified. The output of the amplifier 607 is forwarded to the antenna for transmission.

The various filters that would likely be incorporated in the signal paths of frequency up-converter 600 of FIG. 6 are not shown in the figure in order not to obfuscate the invention. However, it would be apparent to those of skill in the art that the aforementioned filter for band pass filtering out the frequency components at frequencies other than $F_{RF}$ would appear right before the power amplifier 607. Also, low pass filters likely would be positioned before each of the mixers 602, 603 of the quadrature mixer 601 in order to low pass filter the $BB_I$ and $BB_Q$ signals.

Figure 7:
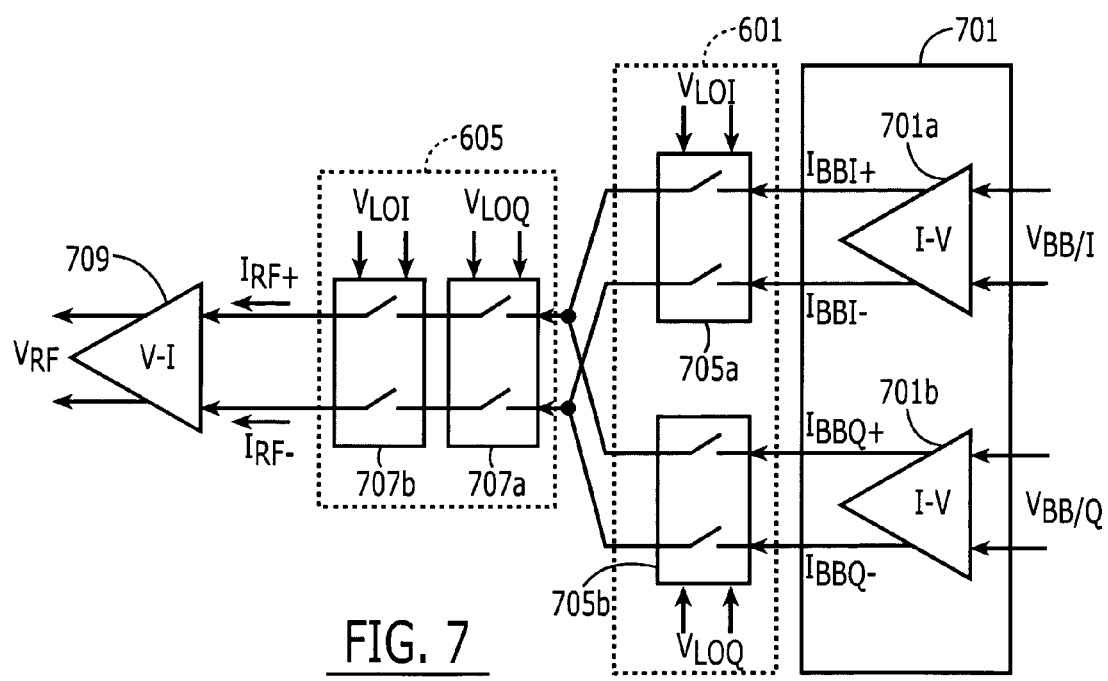
FIG. 7 is a circuit diagram of a quadrature sub-harmonic frequency up-converter in accordance with one possible implementation of the present invention.

FIG. 7 is a more detailed diagram of the frequency up-converter of FIG. 6. FIG. 7 shows a differential embodiment 700 of the converter.

As shown, baseband input signals $V_{BB/I}$, $V_{BB/Q}$ are converted in voltage-to-current conversion stage 701 from voltage domain to current domain by voltage-to-current converters 701*a*, 701*b*. The four differential quadrature outputs of the voltage-to-current converter stage 700 are passed to the two switch cells 705*a*, 705*b* of the quadrature mixer 601. As previously described in connection with FIG. 6, the outputs are combined and fed to the sub-harmonic mixer 605. The multi-phase sub-harmonic mixer 605 may comprise two switch cells 707*a*, 707*b* where the IF differential signal is mixed with the quadrature local oscillator signals, as previously described in connection with FIG. 6. As shown, the multi-phase sub-harmonic mixer comprises two switch cells 707*a*, 707*b* coupled in series, one for mixing the combined differential IF signals with the Q component of the local oscillator and then with the I component of the local oscillator signal (or vice versa). The order of the mixing, i.e., whether the IF signal is first mixed with the I component or the Q component of the local oscillator, is irrelevant. Either order is acceptable. The differential outputs of the sub-harmonic mixer are fed to a current-to-voltage converter 709. If amplification is necessary, an amplifier may be positioned after the converter 709 (not shown). The differential output voltage signals at the desired RF output frequency are then fed to the antenna for transmission.

The switch cells 705*a*, 705*b*, 707*a*, 707*b* can be implemented, for instance, exactly the same as the switch cells used in the exemplary frequency down-converter illustrated in FIG. 5.

The frequency up-conversion and frequency down-conversion techniques and apparatus disclosed herein allow very high frequency operation using local oscillator signals at much lower frequency than the RF transmission frequency. The main benefits of this solution include the need for only a single frequency synthesizer for the local oscillator. Furthermore, the synthesizer operates at a much lower frequency than the RF transmission/receive frequency, i.e., ⅓. Additionally, the technique requires only two local oscillator signals at the same frequency and 90° phase shifted from each other to perform both frequency conversion steps. Moreover, the local oscillator signals can be generated more accurately, less costly, and with less power.

The present invention provides a low-power, low-cost solution to the needs of the new high frequency standards for communication or radar applications.

Having thus described a few particular embodiments of the invention, various alterations, modifications, and improvements will readily occur to those skilled in the art. Such alterations, modifications, and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

I claim:

1. A method for frequency down-converting a first data signal centered at a first frequency to a second data signal containing the same data as said first data signal and centered at a second frequency lower than said first frequency, said method comprising the steps of:

(1) receiving said first data signal at said first frequency;

(2) mixing said first data signal with a local oscillator signal having a third frequency about one third of said first frequency in a sub-harmonic mixer to produce a third data signal having a fourth frequency that is a harmonic frequency of said first frequency and said third frequency;

(3) mixing said third data signal with said first component of said quadrature local oscillator signal at said third frequency to produce a first component of said second data signal centered at said second frequency; and (4) mixing said third data signal with said second component of said quadrature local oscillator signal at said third frequency to produce a second component of said second data signal centered at said second frequency.

2. The method of claim 1 wherein said first data signal comprises a baseband data signal carried on a radio frequency carrier signal.

3. The method of claim 2 wherein said second data signal is centered at 0 Hz.

4. The method of claim 3 wherein said third frequency is ⅓ said first frequency.

5. The method of claim 2 wherein said second data signal is centered at a frequency other than 0 Hz.

6. The method of claim 5 wherein said third frequency is about ⅓ of said first frequency.

7. The method of claim 6 wherein said third frequency is within about 333.3 MHz of ⅓ of said first frequency.

8. The method of claim 1 wherein said third data signal at said fourth frequency comprises a harmonic at about twice said third frequency minus said first frequency.

9. The method of claim 1 further comprising the step of:
(5) amplifying said first data signal prior to step (2).

10. The method of claim 1 further comprising the steps of:
(6) converting said first data signal from the voltage domain to the current domain prior to step (2); and
(7) converting said second data signal from the current domain to the voltage domain after steps (3) and (4).

11. The method of claim 1 wherein step (2) comprises mixing said first data signal with first and second quadrature components of said local oscillator signal.

12. The method of claim 1 wherein step (2) comprises mixing said first data signal with a local oscillator signal having substantially higher amplitude that said first data signal.

13. A frequency down-converter for converting a first data signal centered at a first frequency to a second data signal containing the same data as said first data signal and centered at a second frequency lower than said first frequency comprising:
a local oscillator generating a quadrature signal at a third frequency that is about ⅓ of said first frequency, said quadrature signal having a first component having a first phase and a second component having a second phase 90° out of phase with said first component;
a sub-harmonic mixer coupled to receive said first data signal at a first input terminal thereof and coupled to receive at least one of said first and second components of said local oscillator signal at second and third input terminals thereof, said sub-harmonic mixer generating a third data signal having a fourth frequency that is a harmonic frequency of said first frequency and said third frequency;
a quadrature mixer comprising first and second mixer components, said first mixer component coupled to mix said third data signal with said first component of said quadrature local oscillator signal to produce a first component of said second data signal centered at said second frequency and said second mixer component coupled to mix said third data signal with said second component of said quadrature local oscillator signal to produce a second component of said second data signal centered at said second frequency.

14. The apparatus of claim 13 wherein said first data signal comprises a baseband data signal carried on a radio frequency carrier signal.

15. The apparatus of claim 14 wherein said second data signal is centered at 0 Hz.

16. The apparatus of claim 15 wherein said third frequency is ⅓ said first frequency.

17. The apparatus of claim 14 wherein said second data signal is centered at a frequency other than 0 Hz.

18. The apparatus of claim 17 wherein said third frequency is about ⅓ said first frequency.

19. The apparatus of claim 18 wherein said third frequency is within about 333.3 MHz of ⅓ said first frequency.

20. The apparatus of claim 13 wherein said third data signal at said fourth frequency comprises a harmonic at about twice said third frequency minus said first frequency.

21. The apparatus of claim 13 further comprising:
an amplifier coupled between said first data signal and said first input terminal of said sub-harmonic mixer.

22. The apparatus of claim 13 further comprising:
(6) a voltage to current converter coupled between said first data signal and said first input terminal of said sub-harmonic mixer; and
(7) a current to voltage converter having an input terminal coupled to said quadrature mixer and an output terminal.

* * * * *